(12) United States Patent
Lee

(10) Patent No.: US 7,253,647 B2
(45) Date of Patent: Aug. 7, 2007

(54) PROBE FOR HIGH ELECTRIC CURRENT

(76) Inventor: Chae Yoon Lee, 1547-3 Songjeong-Dong, Gangseo-Gu, Busan (KR)

( * ) Notice: Subject to any disclaimer, the term of this patent is extended or adjusted under 35 U.S.C. 154(b) by 0 days.

(21) Appl. No.: 11/006,938

(22) Filed: Dec. 8, 2004

(65) Prior Publication Data
US 2005/0253605 A1    Nov. 17, 2005

(30) Foreign Application Priority Data
May 17, 2004  (KR)  .................. 10-2004-0034876
Aug. 11, 2004  (KR)  .................. 20-2004-0022923 U

(51) Int. Cl.
*G01R 31/02* (2006.01)
(52) U.S. Cl. .................... 324/754; 324/72.5
(58) Field of Classification Search ................ 324/754, 324/761, 72.5
See application file for complete search history.

(56) References Cited

U.S. PATENT DOCUMENTS

| | | | | | |
|---|---|---|---|---|---|
| 4,050,762 | A | * | 9/1977 | Hines et al. | ................ 439/824 |
| 4,321,532 | A | * | 3/1982 | Luna | ........................ 324/761 |
| 4,597,622 | A | * | 7/1986 | Coe | ........................... 439/421 |
| 4,983,909 | A | * | 1/1991 | Swart et al. | ................ 324/754 |
| 5,032,787 | A | * | 7/1991 | Johnston et al. | ........... 324/761 |
| 5,233,290 | A | * | 8/1993 | Swart | ...................... 324/72.5 |
| 6,159,056 | A | * | 12/2000 | Boyle | ........................ 439/700 |
| 6,208,155 | B1 | * | 3/2001 | Barabi et al. | .............. 324/754 |
| 6,275,054 | B1 | * | 8/2001 | Boyle | ........................ 324/754 |
| 6,821,131 | B2 | * | 11/2004 | Suzuki et al. | ................. 439/73 |

* cited by examiner

*Primary Examiner*—Ha Tran Nguyen
*Assistant Examiner*—Arleen M. Vazquez
(74) *Attorney, Agent, or Firm*—Tuchman & Park LLC

(57) ABSTRACT

A probe used for a high electric current. The prove comprises an outer pipe having a cylindrical configuration which is opened at upper and lower ends thereof; a plunger installed in an upper part of the outer pipe to be elastically extended out of and retracted into the outer pipe, and brought into contact with a contact terminal of a test object; a contact member installed in a lower part of the outer pipe and electrically connected with a contact terminal of a circuit board; and a plurality of contact wires installed at a region where the plunger and the contact member are engaged with each other, to electrically connect the plunger to the contact member, and each having one end which is bent outward.

4 Claims, 5 Drawing Sheets

PROBE FOR HIGH ELECTRIC CURRENT

This application claims priority of pending Korean Patent Application Nos. 2004-34876 filed on May 17, 2004 and 2004-22923 filed on Aug. 11, 2004.

FIELD OF THE INVENTION

The present invention relates, in general, to a probe used for a high electric current and, more particularly, to a probe used for a high electric current, wherein, when a plunger formed to be elastically extended out of and retracted into an outer pipe is pressed by a test object, moved downward and brought into contact with a contact member connected to a circuit board, firm and stable contact between the plunger and the contact member is ensured due to the presence of a plurality of contact wires which are installed in such a way as to be partially inserted into an insertion groove defined in the plunger or the contact member, whereby the reliability of a test can be improved, and current density and contact resistance can be minimized to prevent the probe from being broken due to degradation.

DESCRIPTION OF THE PRIOR ART

As well known to those skilled in the art, a probe for a high electric current is generally used to test a semiconductor chip by applying a high electric current of no less than 5A through the semiconductor chip. In comparison with a probe for testing a semiconductor chip, through which a low electric current passes, the probe for a high electric current is manufactured to have a structure which ensures the formation of a path for allowing the stable flow of an electric current.

Generally, in a probe for testing a semiconductor chip, it is often the case that an electric current concentratedly flows through a path which has a limited area. This path comprises a coil spring and a contact region between the coil spring and an outer pipe. In the case that an electric current of no greater than 5A is applied, even though the electric current flows through the path having a limited area as described above, the lifetime of the probe is hardly influenced by the flow of the electric current. Therefore, modification of the structure can be freely implemented, for example, by rendering increased elasticity to the probe, so that contact stability between component elements can be ensured.

On the contrary, in the case of the probe used for a high electric current, since a high electric current corresponding to 5~500A flows through the probe, the size of the probe for a high electric current is greater than that of a probe for a low electric current. Also, in the probe used for a high electric current, if an electric current concentratedly flows through a coil spring and a limited contact region, the coil spring and the component elements arranged in the limited contact region are likely to be degraded. As a consequence, a test object is apt to be fused or the thermal characteristics of the test object may change, whereby proper operation of the probe cannot be ensured.

Even in the probe used for a high electric current, a structure in which a coil spring is used to elastically move a plunger must necessarily be adopted. Therefore, in the conventional art, due to the uncertainty in securing a contact area between the coil spring and the component elements, the path through which an electric current flows is unstably defined, therefore breakage of the component elements frequently occurs. In the case that any of the component elements is broken, since the remainder of the component elements cannot be reused, the entire probe must be replaced with a new one.

SUMMARY OF THE INVENTION

Accordingly, the present invention has been made keeping in mind the above problems occurring in the prior art, and an object of the present invention is to provide a probe used for a high electric current, which is constructed to stabilize current flow by providing a current flow path that ensures contact stability and that does not pass through a coil spring and by providing a precisely assembled structure, thereby improving test reliability.

Another object of the present invention is to provide a probe used for a high electric current, which is constructed to minimize a current density and a contact resistance, whereby the probe is prevented from being broken due to degradation, and the lifetime of the probe is extended.

Still another object of the present invention is to provide a probe used for a high electric current, which is constructed to be easily assembled and disassembled, thereby allowing the replacement of breakable component elements.

In order to achieve the above objects, according to one aspect of the present invention, there is provided a probe used for a high electric current, comprising: an outer pipe having a cylindrical configuration which is opened at upper and lower ends thereof; a plunger installed in an upper part of the outer pipe to be elastically extended out of and retracted into the outer pipe, and brought into contact with a contact terminal of a test object; a contact member installed in a lower part of the outer pipe and electrically connected with a contact terminal of a circuit board; and a plurality of contact wires installed at a region where the plunger and the contact member engage with each other, to electrically connect the plunger to the contact member, and each having one end which is bent outward.

According to another aspect of the present invention, the plunger is defined at a lower part thereof with an insertion groove through which an upper part of the contact member can be inserted; the contact member is installed in the lower part of the outer pipe with a spring interposed between the plunger and the contact member, and is formed with a wire contacting part which can be inserted into the insertion groove of the plunger; and each of the contact wires has one part which is inserted into the insertion groove of the plunger and the other part which projects out of a lower end of the plunger, is bent toward a circumferential outer surface of the plunger and is brought into close contact with the circumferential outer surface of the plunger by a wire fastening ring fitted around the plunger.

According to another aspect of the present invention, the plunger is formed at a lower part thereof with a wire contacting part; the contact member is installed in the lower part of the outer pipe with a spring interposed between the plunger and the contact member, and is defined at an upper part thereof with an insertion groove through which the wire contacting part of the plunger can be inserted; and each of the contact wires has one part which is inserted into the insertion groove of the contact member and the other part which projects out of an upper end of the contact member, is bent toward a circumferential outer surface of the contact member and is brought into close contact with the circumferential outer surface of the contact member by a wire fastening ring fitted around the contact member.

According to another aspect of the present invention, the outer pipe is formed with an engagement projection which projects inward; and a portion of the plunger which is positioned in the outer pipe is reduced in its diameter to form a shoulder which engages with the engagement projection to limit the upward movement of the plunger.

According to another aspect of the present invention, the part of each contact wire that is inserted into the insertion groove is curved toward the center of the insertion groove.

According to another aspect of the present invention, the lower part of the plunger is decreased in its outer diameter; and the wire fastening ring is fitted around the lower part of the plunger so that circumferential outer surfaces of the plunger and the wire fastening ring are flush with each other.

According to another aspect of the present invention, the upper part of the contact member is decreased in its outer diameter; and the wire fastening ring is fitted around the upper part of the contact member so that circumferential outer surfaces of the contact member and the wire fastening ring are flush with each other.

According to still another aspect of the present invention, a hemispherical protrusion is formed at a bottom of the insertion groove so that the inner ends of the contact wires are captured between the hemispherical protrusion and a circumferential inner surface of the plunger which defines the insertion groove.

According to yet another aspect of the present invention, one end of the wire fastening ring is formed with an inward flange so that bent portions of the contact wires can be supported by the inward flange of the wire fastening ring.

According to a further aspect of the present invention, inner ends of the contact wires are captured in the insertion groove, and outer ends of the contact wires are squeezed against the circumferential outer surface of the plunger or the contact member by the wire fastening ring, whereby the other part of each contact wire is rounded toward a center of the insertion groove.

By the features of the present invention, advantages are provided in that, since current flow is stabilized by a current flow path that ensures contact stability and that does not pass through a coil spring and by a precisely assembled structure, test reliability can be improved.

Also, due to the fact that current density and contact resistance are minimized, the probe is prevented from being broken due to degradation, and the lifetime of the probe can be extended.

Further, because the probe is constructed to be easily assembled and disassembled, the replacement of breakable component elements is possible.

BRIEF DESCRIPTION OF DRAWINGS

The above and other objects, features and other advantages of the present invention will be more clearly understood from the following detailed description when taken in conjunction with the accompanying drawings, in which.

DETAILED DESCRIPTION OF PREFERRED EMBODIMENTS

Figure 1:
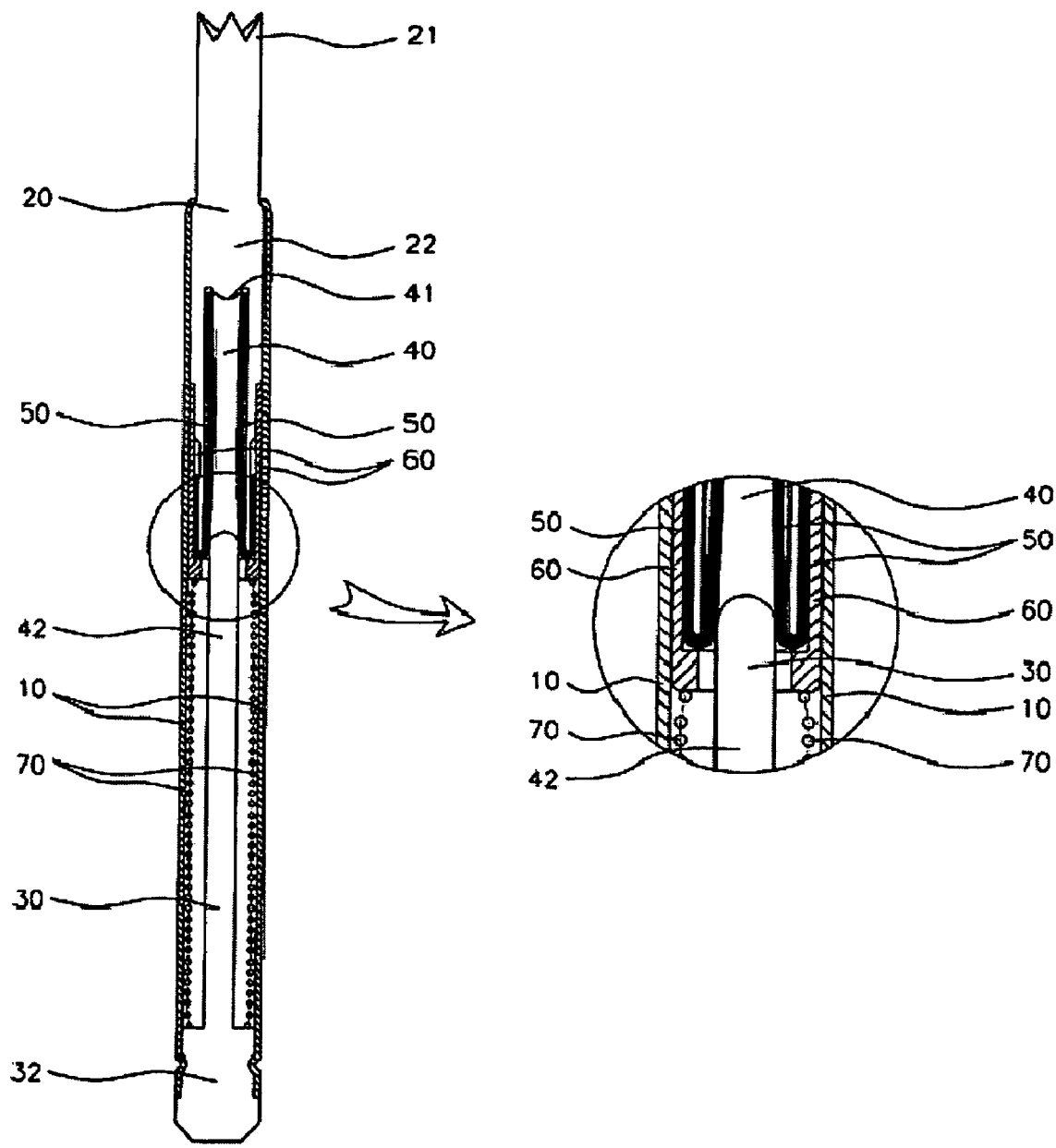
FIG. 1 is a partially-enlarged longitudinal cross-sectional view illustrating a first embodiment of a probe used for a high electric current according to the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
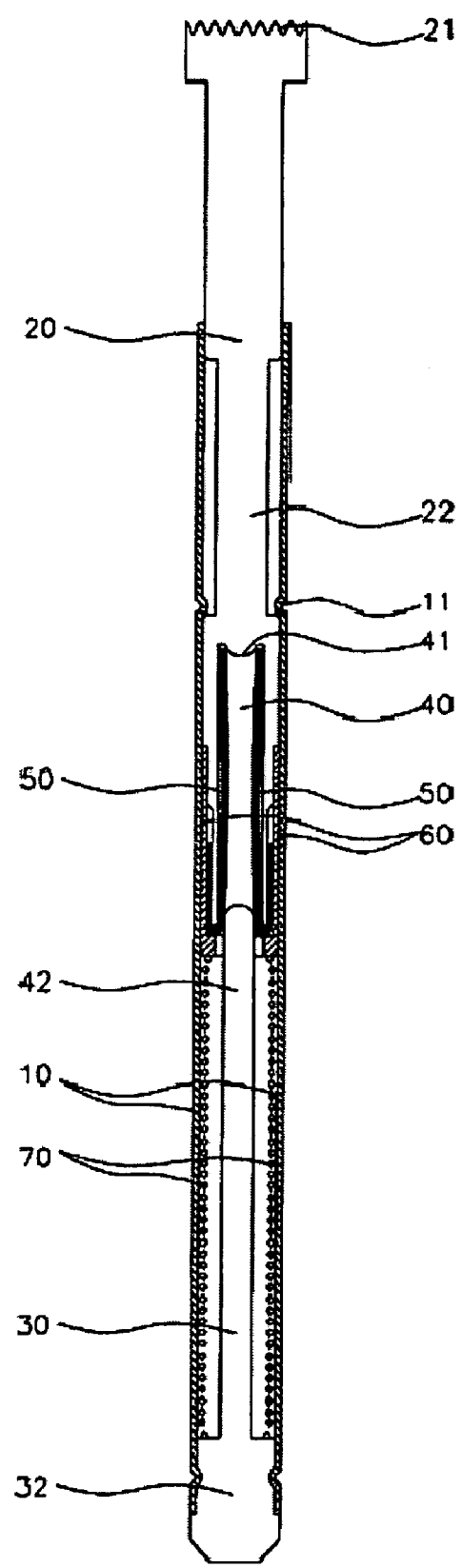
FIG. 2 is a longitudinal cross-sectional view illustrating a second embodiment of a probe used for a high electric current according to the present invention.
Figure 3:
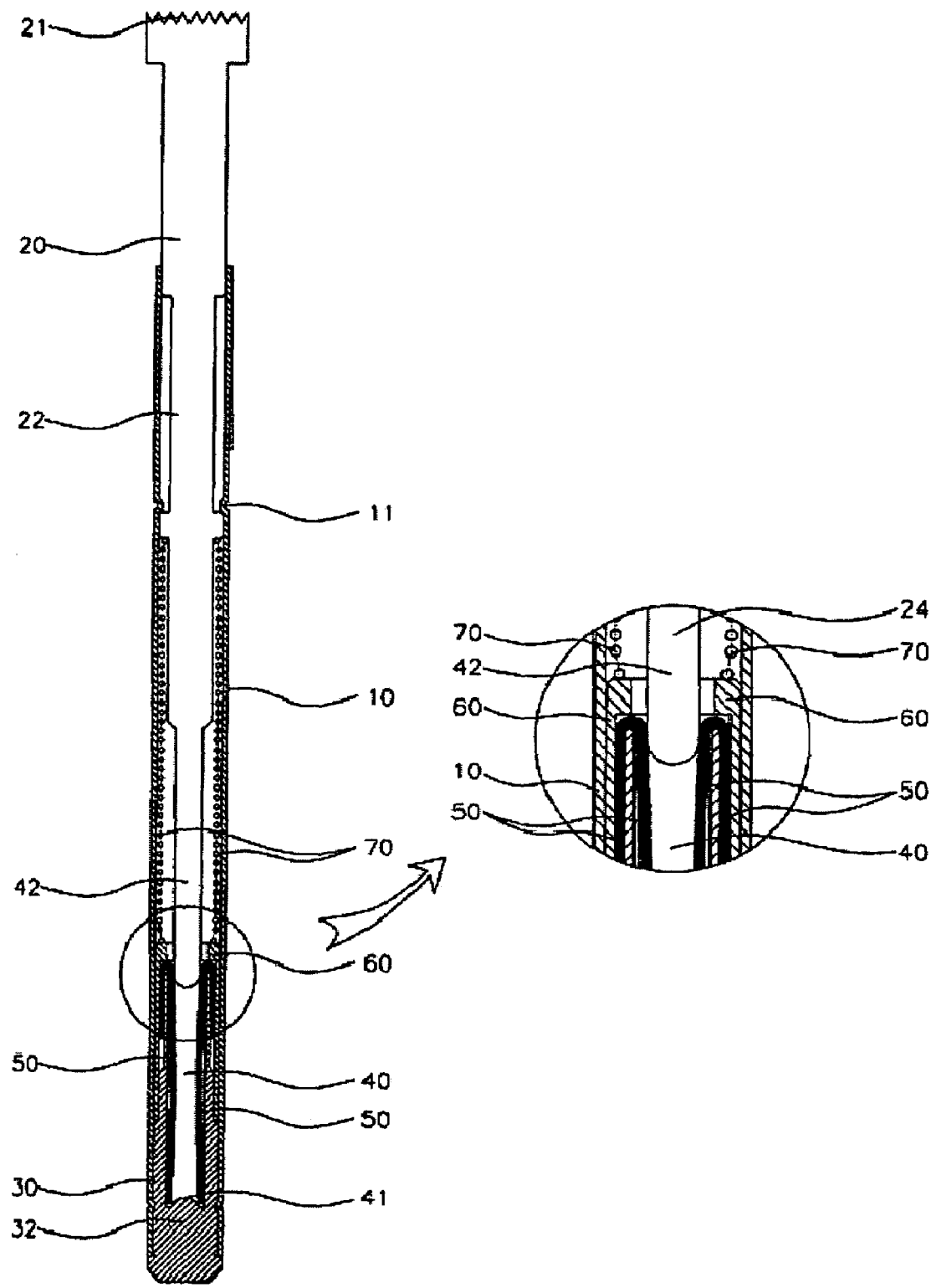
FIG. 3 is a partially-enlarged longitudinal cross-sectional view illustrating a third embodiment of a probe used for a high electric current according to the present invention.
Figure 4:
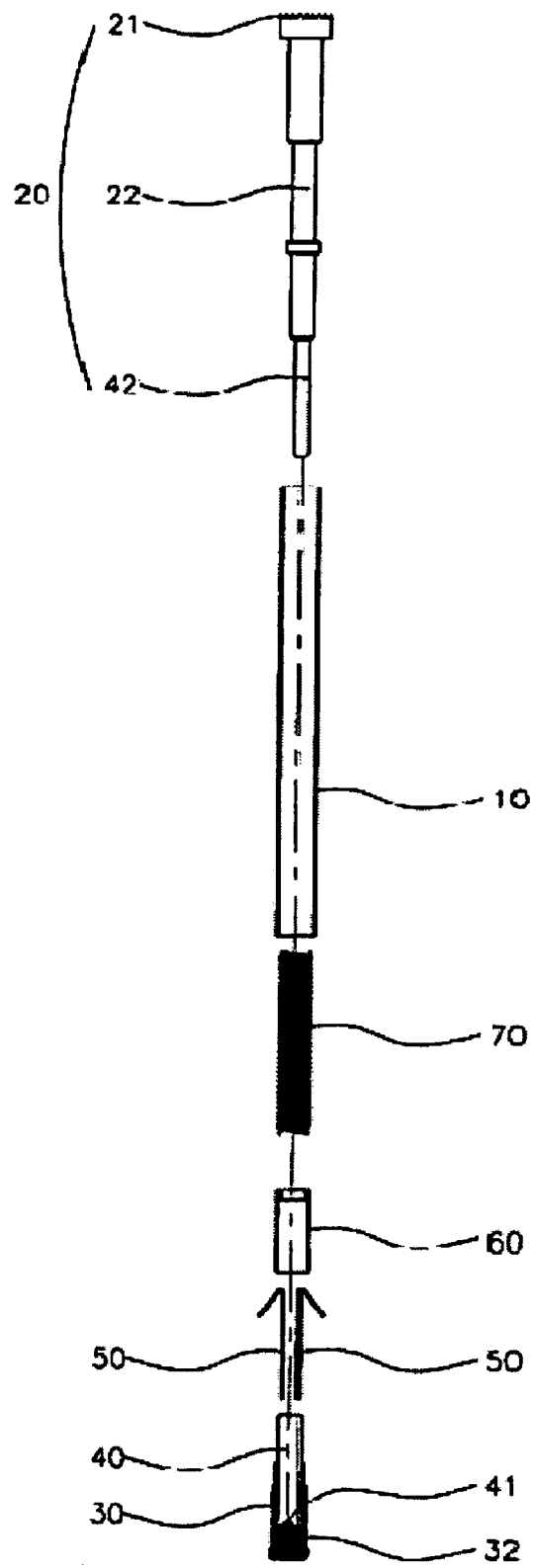
FIG. 4 is an exploded longitudinal cross-sectional view of FIG. 3.
Figure 5:
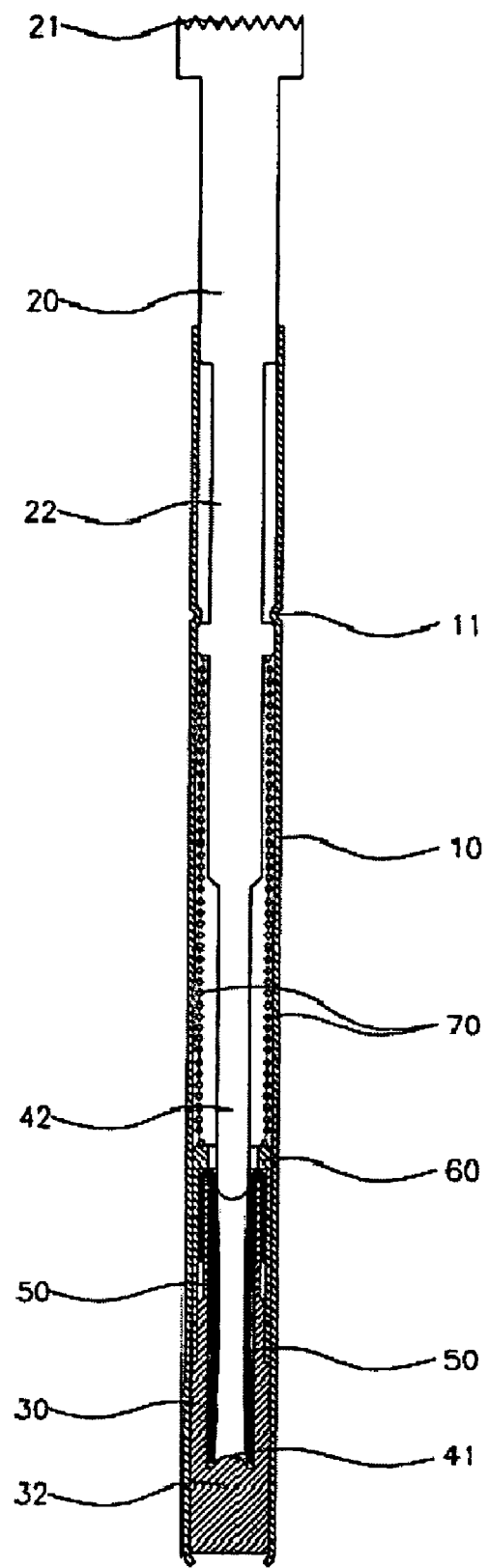
FIG. 5 is a longitudinal cross-sectional view illustrating a fourth embodiment of a probe used for a high electric current according to the present invention.

FIG. 1 is a partially-enlarged longitudinal cross-sectional view illustrating a first embodiment of a probe used for a high electric current according to the present invention; FIG. 2 is a longitudinal cross-sectional view illustrating a second embodiment of a probe used for a high electric current according to the present invention; FIG. 3 is a partially-enlarged longitudinal cross-sectional view illustrating a third embodiment of a probe used for a high electric current according to the present invention; FIG. 4 is an exploded longitudinal cross-sectional view of FIG. 3; and FIG. 5 is a longitudinal cross-sectional view illustrating a fourth embodiment of a probe used for a high electric current according to the present invention.

A probe used for a high electric current according to the present invention comprises a plunger 20 which is elastically extended out of and retracted into an outer pipe 10 by being pressed by a test object, and a contact member 30 which is fixedly installed in a lower part of the outer pipe 10 and is electrically connected at its lower end to a circuit board. The probe used for a high electric current according to the present invention further comprises contact wires 50, and a wire fastening ring 60.

First and second embodiments as shown in FIGS. 1 and 2 will be explained. In these first and second embodiments, the outer pipe 10 has a cylindrical configuration which is open at upper and lower ends thereof. The plunger 20 is installed in the outer pipe 10 such that an upper part of the plunger 20 projects upward out of the outer pipe 10. An upper end of the plunger 20, which is brought into contact with and pressed by the test object, is provided with a plurality of detection protuberances 21 for improving the reliability of contact between the plunger 20 and the test object. An insertion part 22 of the plunger 20 which is positioned in the outer pipe 10 has a contour which corresponds to a cross-sectional shape of the outer pipe 10, to prevent the release of the plunger 20 from the outer pipe 10. Below the insertion part 22 of the plunger 20, the plunger 20 is defined with an insertion groove 40. The insertion groove 40 extends upward from a lower end of the plunger 20. An upper part of the contact member 30 which is fixedly installed in the lower part of the outer pipe 10 can be inserted into the insertion groove 40. The insertion groove 40 has a cross-sectional area which substantially corresponds to that of the upper part of the contact member 30.

The contact wires 50 are installed in such a way as to be partially inserted into the insertion groove 40. When the plunger 20 is pressed by the test object and moved downward, the contact wires 50 are brought into direct contact with the contact member 30 which is inserted into the insertion groove 40, to form a main path through which an electric current flows.

The configuration of the contact wire 50 is not limited to that illustrated in FIGS. 1 and 2, in which the contact wire curves toward the center of the insertion groove 40. It can be envisaged that the contact wire 50 can be bent toward the center of the insertion groove 40 in consideration of a material, the size of the probe and a configuration of the upper part of the contact member 30.

Even though the contact wire 50 is configured as shown in the first and second embodiments, by separating the upper ends of the contact wires 50 from an upper end of the insertion groove 40 by a predetermined distance, when the contact wires 50 are squeezed by the contact member 30 against a circumferential inner surface of the insertion groove 40, the curved portions of the contact wires 50 are flattened, whereby the contact area between the contact wires 50 and the contact member 30 can be increased, and the friction between the contact wires 50 and the contact member 30 can be minimized. If the upper ends of the contact wires 50 are secured at the upper end of the insertion groove 40, as the portions of the contact wires 50 which are brought into contact with the contact member 30 are squeezed against the circumferential inner surface of the insertion groove 40 and are elastically deformed, the contact area between the contact wires 50 and the contact member 30 is increased, whereby contact reliability can be improved.

Lower parts of the contact wires 50 which project out of the insertion groove 40 are bent upward. The bent lower parts of the contact wires 50, which are positioned outside the plunger 20, are squeezed against and fixed to a circumferential outer surface of the plunger 20 by a wire fastening ring 60 which has a substantially cylindrical configuration and is fitted around the lower part of the plunger 20.

In the first embodiment, an upper end of the outer pipe 10 has a contour which is slightly rolled inward, and the insertion part 22 of the plunger 20 which is positioned in the outer pipe 10 is formed to have a contour which corresponds to that of the upper end of the outer pipe 10. The portion of the plunger 20 which projects out of the outer pipe 10 has an outer diameter which corresponds to an inner diameter of the upper end of the outer pipe 10.

In the second embodiment, a middle portion of the outer pipe 10 is formed with an engagement projection 11 which projects inward. The portion of the plunger 20 that is positioned in the outer pipe 10 is reduced in its diameter through a length corresponding to a distance through which the plunger 20 is moved upward and downward, to form a shoulder which engages with the engagement projection 11 to limit the upward movement of the plunger 20.

In the first and second embodiments, the lower part of the plunger 20 decreases in its outer diameter. Due to this fact, when the wire fastening rings 60 are fitted around the lower part of the plunger 20 while squeezing the outer ends of the contact wires 50 against the circumferential outer surface of the plunger 20, the circumferential outer surfaces of the plunger 20 and the wire fastening ring 60 are flush with each other. That is to say, the wire fastening ring 60 is formed to have the same outer diameter as the upper part of the plunger 20 which projects out of the outer pipe 10. A lower end of the wire fastening ring 60 is formed with an inward flange so that the bent portions of the contact wires 50 can be supported by the inward flange and the outer ends of the contact wires 50 can be squeezed against the circumferential outer surface of the plunger 20 by the inward flange. Hence, the assemblability of the probe can be improved, and close and firm contact between the contact member 30 and the plunger 20 can be ensured.

The contact member 30 is fixedly installed in a lower part of the outer pipe 10, with a spring 70 interposed between the wire fastening ring 60 and the contact member 30. The contact member 30 is formed with a wire contacting part 42 which can be inserted into the insertion groove 40 of the plunger 20 to be reliably brought into contact with the contact wires 50.

Next, third and fourth embodiments shown in FIGS. 3 through 5 will be described.

In these third and fourth embodiments, a probe used for a high electric current according to the present invention comprises a plunger 20 installed in an outer pipe 10 in a manner such that an upper part of the plunger 20 can be elastically extended out of and retracted into the outer pipe 10. At a lower part of the outer pipe 10 in which the plunger 20 is not installed, there are provided a contact member 30 which closes a lower opening of the outer pipe 10 and is fixedly coupled to the outer pipe 10, contact wires 50 which are installed in such a way as to be hooked on an upper end of the contact member 30, and a wire fastening ring 60 which securely fastens the contact wires 50 against the contact member 30.

The contact member 30 is composed of an inner cylindrical part which is defined with an insertion groove 40, and a coupling part 32 which is coupled to the outer pipe 10. The inner cylindrical part is inserted into the outer pipe 10 with a gap defined between a circumferential inner surface of the outer pipe 10 and a circumferential outer surface of the inner cylindrical part. A circumferential outer surface of the coupling part 32 snugly fits into the outer pipe 10. The coupling part 32 extends out of a lower end of the outer pipe 10.

Each of the contact wires 50 comprises an insertion part and an engagement part. The insertion part is straight or curved, is inserted into the insertion groove 40, and has a length approximately the same as the vertical length of the insertion groove 40. The engagement part of each contact wire 50 is bent downward at an upper end of the insertion part. Therefore, the engagement part of each contact wire 50 has a hook-shaped configuration that engages with an upper end of the upper part of the contact member 30 which defines the insertion groove 40. The engagement part is positioned outside the insertion groove 40.

The wire fastening ring 60 serves as a component element for securely fastening the plurality of contact wires 50, which are placed around the upper end of the insertion groove 40, to the inner cylindrical part of the contact member 30. The wire fastening ring 60 is fitted around the upper end of the inner cylindrical part of the contact member 30, to squeeze the engagement parts of the contact wires 50 against the circumferential outer surface of the contact member 30.

In the third embodiment, the inner cylindrical part of the contact member 30 has a structure in which multiple stepped portions are formed on the circumferential outer surface of the inner cylindrical part of the contact member 30 so that outer diameters of the stepped portions gradually increases toward the lower end of the inner cylindrical part of the contact member 30, appropriate to the thickness of the engagement parts of the contact wires 50 and the inner diameter of the wire fastening ring 60.

A hemispherical protrusion 41 is formed at a bottom of the insertion groove 40. The hemispherical protrusion 41 causes lower ends of the contact wires 50 to be captured between the hemispherical protrusion 41 and the circumferential inner surface of the contact member 30 which defines the insertion groove 40. Therefore, when the contact wires 50 are pressed or flexed downward, middle portions of the insertion parts of the contact wires 50 which are not captured by any component element can be naturally curved toward the center of the insertion groove 40.

Due to the fact that the contact wires 50 are bent in the insertion groove 40, the insertion parts of the contact wires 50 can be squeezed against the circumferential inner surface of the insertion groove 40 by a wire contacting part of the plunger 20 which is inserted into the insertion groove 40, whereby a path for transmitting an electric current, which flows from an upper end of the plunger 20 into the insertion groove 40 to the contact member 30 which is installed at the lower part of the outer pipe 10, can be reliably formed.

In the third embodiment, a lower end of the coupling part 32 of the contact member 30 extends out of the outer pipe 10 to have the same outer diameter as the outer pipe 10. When the contact member 30 is fitted into the lower end of the outer pipe 10, an enlarged diameter portion of the coupling part 32 is engaged with and closes the lower end of the outer pipe 10 to provide a smooth finished appearance.

An upper end of the wire fastening ring 60 is formed with an inward flange so that the bent portions of the contact wires 50 can be supported by the inward flange of the wire fastening ring 60 and the outer ends of the contact wires 50 can be squeezed against the circumferential outer surface of the contact member 30 by the inward flange. Also, a spring 70 which is disposed between the plunger 20 and the wire fastening ring 60 can be stably supported by the inward flange.

The outer pipe 10 comprises an upper engagement protrusion 11 and a lower engagement protrusion. The upper engagement protrusion protrudes inward to limit the upward movement of the plunger 20, and the lower engagement protrusion protrudes inward to securely couple the contact member 30 to the outer pipe 10.

Inside the outer pipe 10, there are sequentially installed the plunger 20, which is limited in its upward movement by the upper engagement protrusion 11, the coil spring 70 which provides an elastic force to the plunger 20, the wire fastening ring 60 which provides a supporting surface for supporting a lower end of the coil spring 70 and squeezes the contact wires 50 against the circumferential outer surface of the contact member 30, and the contact member 30 which is fixedly installed in the outer pipe 10 below the wire fastening ring 60 by the lower engagement protrusion.

An upper end of the plunger 20, which is brought into contact with and pressed by the test object, is formed with a plurality of detection protuberances 21. The lower part of the plunger 20 is formed with the wire contacting part 42 which is to be brought into electric contact with the contact wires 50 when inserted into the insertion grove 40.

In the fourth embodiment shown in FIG. 5, unlike the first through third embodiments, a lower end of the outer pipe 10 is rolled slightly inward, and a lower end of the coupling part of the contact member 30 is secured inside the lower end of the outer pipe 10. Therefore, due to the fact that an inner diameter of the outer pipe 10 is decreased to define an opening, the lower end of the contact member 30 can be firmly secured in the outer pipe 10.

By initially forming the insertion parts of the contact wires 50 to have the bent configuration, even when the hemispherical protrusion 41 is not formed at the bottom of the insertion groove 40, the contact wires 50 can remain raised toward the center of the insertion groove 40. Even when the contact wires 50 are not initially bent at an acute angle but are bent to conform to a contour of the upper end of the insertion groove 40, if the insertion parts of the contact wires 50 have a length greater than that of the insertion groove 40, bending of the contact wires 50 can be reliably implemented. Also, because it is preferred that the upper part of the contact member 30 which defines the insertion groove 40 be varied in its configuration in a diversity of ways depending upon configurations of the contact wires 50 and the wire fastening ring 60, it is to be readily understood that the present invention is not limited to the first through third embodiments as described above and instead, various modifications can be made without departing from the scope and spirit of the present invention.

In the probe used for a high electric current according to the present invention, an electric current transmitted from the test object flows through the detection protuberances 21 to the lower part of the insertion part 22. Then, the electric current is transmitted through the contact wires 50 to the contact member 30 which is connected to the circuit board. The greater the number of contact wires 50, the more the contact area between the wire contacting part 42 and the contact member 30 is enlarged, whereby contact stability is improved. Also, due to the provision of the current flow path including the contact area between the contact wires 50 and the contact member 30, stable current flow can be ensured and test reliability can be improved.

Since the current flow path is defined to include the contact area between the contact wires 50 and the contact member 30, current density and contact resistance can be significantly reduced to prevent the probe from being broken due to degradation.

Moreover, because the contact member 30, the contact wires 50 and the wire fastening ring 60 can be easily assembled with and disassembled from one another, replacement of component parts which are liable to fatigue and be degraded can be easily implemented. Also, since the component elements which are not broken can be reused, unnecessary disposal of component elements can be avoided.

As apparent from the above description, the probe used for a high electric current according to the present invention provides advantages in that, since current flow is stabilized by providing a current flow path that ensures contact stability and that does not pass through a coil spring and by providing a precisely assembled structure, test reliability can be improved.

Also, due to the fact that current density and contact resistance are minimized, the probe is prevented from being broken due to degradation, and the lifetime of the probe can be extended.

Further, because the probe is constructed to be easily assembled and disassembled, the replacement of breakable component elements is allowed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A probe for testing a test object with a high electric current, comprising:
   an outer pipe having a cylindrical configuration which is opened at upper and lower ends thereof;
   a plunger received in an upper part of the outer pipe and being slidably extendable out from and retractable into the outer pipe, and configured to contact with the test object for testing;
   a contact member installed in a lower part of the outer pipe and for connecting to a contact terminal of a circuit board;
   a spring disposed between the plunger and the contact member for elastically biasing the plunger with respect to the outer pipe;

one of the plunger and the contact member having an insertion groove at a junction where the plunger and the contact member engage with each other, and the other one of the plunger and the contact member having a terminal portion configured to be slidably receivable in the insertion groove; and a plurality of contact wires extending along and installed at the insertion groove such that the plunger electrically connects with the contact member via the contact wires during at least when the plunger is slidably retracted;

wherein the contact member includes the insertion groove formed at an upper part thereof, and at least a substantial portion of the plurality of contact wires are installed in the insertion groove, and a lower part of the plunger is configured to be slidably receivable in the insertion groove while contacting with the contact wires for enabling the electrical connection of the plunger with the contact member via the contact wires;

wherein an upper end portion of the contact wires extend out from the insertion groove and are bent outwards and fixed at the contact member with a wire fastening ring attached at an outer periphery of the contact member.

2. The probe of claim 1, wherein the wire fastening ring includes an inward flange so that bent portions of the contact wires can be supported by the inward flange of the wire fastening ring.

3. The probe of claim 1, wherein the upper part of the contact member includes a portion having a reduced outer diameter, and the wire fastening ring is attached at the reduced outer diameter of the contact member so that circumferential outer surfaces of the contact member and the wire fastening ring are flush with each other.

4. The probe of claim 1, wherein the spring is disposed between the wire fastening ring and the plunger for elastically biasing the plunger.

* * * * *